(12) United States Patent
Kostrun et al.

(10) Patent No.: US 10,945,324 B2
(45) Date of Patent: Mar. 9, 2021

(54) EXTERNAL ASSESSMENT DEVICE FOR A LIGHTING SYSTEM AND METHOD OF ASSESSING A LIGHTING SYSTEM

(71) Applicant: OSRAM GmbH, Munich (DE)

(72) Inventors: Marijan Kostrun, Rowley, MA (US); Anant Aggarwal, Waltham, MA (US)

(73) Assignee: Osram GmbH, Munich (DE)

(*) Notice: Subject to any disclaimer, the term of this patent is extended or adjusted under 35 U.S.C. 154(b) by 434 days.

(21) Appl. No.: 15/826,813

(22) Filed: Nov. 30, 2017

(65) Prior Publication Data

US 2019/0166673 A1 May 30, 2019

(51) Int. Cl.
| | | |
|---|---|---|
| *H05B 45/58* | (2020.01) | |
| *G01R 31/44* | (2020.01) | |
| *H05B 45/50* | (2020.01) | |
| *H05B 47/21* | (2020.01) | |

(52) U.S. Cl.
CPC .............. *H05B 45/58* (2020.01); *G01R 31/44* (2013.01); *H05B 45/50* (2020.01); *H05B 47/22* (2020.01)

(58) Field of Classification Search
CPC ....... H04L 1/00; H04L 2201/00; H05B 31/00; H05B 2203/00; G01C 1/00; G05B 1/00; G05B 19/00; G06K 1/00; G06K 2207/00
See application file for complete search history.

(56) References Cited

U.S. PATENT DOCUMENTS

| | | |
|---|---|---|
| 2006/0028155 A1 | 2/2006 | Young |
| 2010/0225235 A1 | 9/2010 | Nagase |
| 2010/0272447 A1* | 10/2010 | Kolze .............. H04B 10/25751 398/192 |
| 2010/0296285 A1* | 11/2010 | Chemel ................. F21V 29/763 362/235 |
| 2011/0089855 A1 | 4/2011 | Roberts et al. |
| 2011/0190694 A1* | 8/2011 | Lanier, Jr. ......... A61M 5/14216 604/67 |
| 2011/0285526 A1 | 11/2011 | Tanaka et al. |
| 2012/0290241 A1 | 11/2012 | Nguyen et al. |

(Continued)

FOREIGN PATENT DOCUMENTS

| | | |
|---|---|---|
| DE | 10 2009 017 989 A1 | 10/2010 |
| EP | 3082383 A1 | 10/2016 |

(Continued)

OTHER PUBLICATIONS

OSRAM; "Application Guide"; https://www.pennelcomonline.com/Images/ProductData/LEDOT45700LTCS-1.pdf; Sep. 30, 2011; 50 pages.

(Continued)

*Primary Examiner* — Jermele M Hollington
*Assistant Examiner* — Temilade S Rhodes-Vivour
(74) *Attorney, Agent, or Firm* — Viering, Jentschura & Partner MBB

(57) ABSTRACT

An assessment device for a lighting system, the device comprising: an input terminal which corresponds to an output terminal of a driver; an output terminal which corresponds to an input terminal of a light engine; a voltage regulator configured to provide power to the microcontroller, wherein the microcontroller is configured to sample an LED+ line voltage and an LED− line voltage with respect to a ground; and wherein the device is independent of the driver and the light engine.

18 Claims, 6 Drawing Sheets

(56) References Cited

U.S. PATENT DOCUMENTS

| | | | |
|---|---|---|---|
| 2013/0063035 A1 | 3/2013 | Baddela et al. | |
| 2013/0258312 A1* | 10/2013 | Lewis | G01S 17/10 |
| | | | 356/4.01 |
| 2013/0313985 A1* | 11/2013 | Choi | H05B 45/10 |
| | | | 315/192 |
| 2014/0252246 A1* | 9/2014 | Rossi | G01N 21/6486 |
| | | | 250/458.1 |
| 2015/0146751 A1* | 5/2015 | Downing | H05B 45/10 |
| | | | 372/38.01 |
| 2015/0351205 A1* | 12/2015 | Clark | H05B 33/0845 |
| | | | 315/149 |
| 2016/0309562 A1 | 10/2016 | Wuppinger et al. | |
| 2017/0184659 A1 | 6/2017 | Jayawardena et al. | |
| 2017/0343695 A1* | 11/2017 | Stetson | G01R 33/032 |

FOREIGN PATENT DOCUMENTS

| | | |
|---|---|---|
| JP | 2012060814 A | 3/2012 |
| WO | 2013110027 A1 | 7/2013 |
| WO | 2016128413 A1 | 8/2016 |

OTHER PUBLICATIONS

International Search Report received for international application No. PCT/EP2018/080165, dated Feb. 25, 2019, 7 pages (for informational purpose only).

* cited by examiner

EXTERNAL ASSESSMENT DEVICE FOR A LIGHTING SYSTEM AND METHOD OF ASSESSING A LIGHTING SYSTEM

TECHNICAL FIELD

Various aspects of this disclosure relate generally to a device and method that allow assessment of a light driver and a light engine.

BACKGROUND

Electrolytic capacitors (e-caps) have a short life expectancy of around 20,000 hours, which largely determines the life of an LED system, including the driver.

LED drivers used for outdoor lighting typically belong to so-called, switch mode power supply (SMPS) circuits. The SMPS produces noise on LED supply lines and from the noise statistical properties, condition of the SMPS as well as of the LED light engine can be assessed.

Typically, lifetime is determined by integrated firmware hidden within the drivers themselves. These are generally proprietary solutions that are typically advertised in the context of the driver family that provides it.

More and more systems are assembled with components from different vendors. A luminaire manufacturer may purchase LED drivers from third-parties for lower costs, better performance, etc. However, the luminaire manufacturer does not have a means to modify the third party driver and introduce lifetime assessment externally.

Some devices purport to assess the age of the light engine, however, these devices are not configured to assess and measure the performance of the driver and the light engine with the same device.

Some devices may assess the condition of e-caps in SMPS. For instance using a digital signal processor (DSP) circuit to collect the voltage and current fluctuations, and from their high frequency content, assessing the capacitor state or internal resistance. However, this method requires continuous sampling of the voltage and current signals.

SUMMARY

In view of the above, it would be advantageous if this expertise could be put into a separate electric circuit.

E-cap aging has been characterized by accelerated thermal cycling. Where the changes in current and voltage values may be assessed across the LED string over time and mapped to corresponding changes in the effective series resistance of the e-cap. From this, the remaining life of the LED driver may be determined. This capability may be implemented in a customized LED driver circuit to predict the remaining life.

An assessment device for a lighting system, for example an outdoor lighting system, used for measuring the remaining useful life of a driver, namely an LED driver, where the LED driver implements either LEDSet control interface, or 0-10 V control interface, both of which may be standard interfaces for a driver. The primary task of the device is to assess the lifetime of the driver and the electric and thermal operating conditions of the light engine. The device may additionally have extended functionality with add-on modules; e.g. have a communication interface through which the lifetime and operating status may be delivered to an external entity; it may be able to control the driver, e.g. through DALI or 0-10V interface; or may support different sensor modules, the data from which is broadcasted off-site, or used on-site in choosing optimal operating conditions for the light engine.

The device may access the remaining useful life with LEDSet or 0-10V standard interfaces. This may be advantageous as the device may be used on any driver with such an interface. Such a configuration allows a user to know the remaining useful life of a driver which may be valuable in planning preventative maintenance of the lighting system.

The device may allow an assessment of age, control and connectivity of the driver, but on its own is independent of the driver. As the device acts as an add-on to the driver, and allows low-cost low-functionality third-party drivers to provide similar functionality to the more expensive integrated driver. The range of functionality of the add-on allows for a greater flexibility in pricing, where an end-user may choose the desired features.

The device carries input terminals that match all the output and control terminals of the driver. Namely, the LED+ line of the driver matches the LED+ line of the device, the LED− line of the driver matches the LED− line of the device. In an LEDSet standard interface the control terminals, ground and voltage set (VSET) correspond respectively to ground and voltage control (VCNTL) of the device. Similarly, in a 0-10V standard interface driver, zero and VSET correspond to matching control terminals in the device.

The device also may carry output terminals that match the inputs of the light engine. For example, LED+ and LED− lines of the device may match the LED+ and LED− lines of the device. Additionally, the device and the light engine may comprise a matching digital communication interface or module for additional functionality of the light engine, for example, a 1-wire interface for EEPROM or a temperature sensor.

Advantageously, the device may be connected to the driver early in its lifecycle, such as when the driver is new, or has a known condition or number of hours of operation. The device follows the functioning of the driver, and keeps track of its operating history, such as in dedicated non-volatile memory. By comparing how the operating parameters and their statistical distributions change in time, the device is capable of assessing the age of the driver by comparing it to the known or new state.

The device may be further configured to control the light output, or dim, the light engine.

Where the device is not expected to dim the light engine, it may advantageously be that only a ground connection of the device is connected to GNDSET of the driver in the case of a LEDSet standard interface or to ground (GND) of the driver in the case of a 0-10V standard interface driver.

The device may comprise a digital-to-analog converter (DAC), a voltage regulator (VR) that converts high voltage from lines LED+ and GND to the voltage needed for the operation of the microcontroller and DAC. In parallel with the VR there is a high resistance voltage divider which value depends upon the voltage provided by the driver. This voltage divider may be used by the microcontroller to obtain through the first analog-to-digital converter (ADC1) information about the electric potential of the LED+ line to the GND. Similarly, the second ADC (ADC2) measures the potential difference between the LED− line and GND.

The microcontroller may be configured to be a 32-bit microcontroller which may do fast analog-to-digital sampling, at least at the rate of 1,000,000 samples per second (SPS), where it is assumed that the sampling rate is sufficiently above, e.g. 10 times, the maximal or maximum switching frequency of the Switch Mode Power Supply (SMPS) comprising the driver, not to exceed 100,000 Hz.

For the device that is configured to dim the light engine, the desired forward current is set by setting the output voltage of the DAC that is directly connected to the control input in the case of a 0-10V interface driver, or, in the case of a LEDSet interface driver controlling the resistance of a FET through which the VSET is connected to GND.

For the purpose of assessing the lifetime of a driver, the microcontroller runs a logic which may be termed Almost Periodic Burst Sampling, which may comprise:

First, at some high frequency in the range of a few kHz to 1/10 of the switching frequency of the SMPS, the microcontroller, through time interrupt enters the acquisition state. The time interrupt may refer to generating an interrupt using an available timer. In time interrupts there may be a fixed time period. In an almost periodic burst sampling, this period may be adjusted after each interrupt resulting in a time sequence of interrupts that is close to periodic but not exact.

Second, in the interrupted state, the microcontroller may initiate a burst of a sequence of fast ADC that are initiated at each interrupt. The burst may be of a length of some power of 2, i.e. 2, 4, 8 or 16, of fast ADC in which the voltages on the LED+ and LED− lines are sampled with respect to GND. Over each signal sample of length 2, 4, 8 or 16, the sample mean of the voltages and the maximum difference between two data points in the sample are extracted. Powers of 2 are used because for calculating the mean value, this results in a shift operation rather than an integer division.

Third, the sample mean may be averaged with other sample means collected within a certain time period, for example 2 seconds, to the overall average of the LED+ and LED− line.

Fourth, two additional steps may be performed from the collected maximal difference. The maximal difference is averaged with other sampled maximal differences. This number is combined with either the known such value at zero-hours, or to a similarly measured value for a driver with a known history or state. From this, the remaining useful life of the driver may be estimated. In the memory of the microcontroller, the highest 16 values of the maximal sample differences may be kept, along with how many times each of the values appeared according to the total duration of the measurements used to assess the age of the driver and the light engine. In creating the histogram of maximal sample differences, the bins are determined either from the memory wherein the device may recognize or recall from memory the properties of the driver, or they may be estimated from the zero-hours measurement, wherein the statistics are known.

Lastly the method for assessing the age of the driver is based on estimating the histogram of the maximal sample differences, or extreme events. During the sequence of fast ADC sampling of LED+ and LED− lines, the minimum and maximum may be determined then the maximum to minimum. In literature this may be considered an extreme event. The estimated histogram may prove two pieces of information. First, it may provide information concerning the status of the Aluminum electrolytic capacitor in the output of the driver that is used that is used for energy storage. As the capacitor ages its internal resistance increases. This increase creates a drift in the average maximal sample difference that may be captured by the ADC of the microcontroller provided that the sampling rate is sufficiently high. Second, it may provide information on the operation of the SMPS, as degraded performance may manifest itself in skewed statistics of extreme events compared to normal operation.

Additionally, the device itself may contain a communication module for receiving, e.g. setting the dimming level, and sending e.g. remaining useful life, information. Examples of such communication modules may include, but are not limited to: Digitally Addressable Lighting Interface (DALI), Ethernet (wired or wireless), Long Range Radio (LoRA) or ZigBee modules. These modules may communicate through some digital protocol, for example UART, I2C or SPI, to the microcontroller.

The condition of the light engine may be assessed through two methods. First, in an embodiment where the device is not configured to dim the light engine, the average forward voltage and current of the light engine are measured. These values are regularly stored in a local non-volatile memory for further analysis and comparison. Second, if the device is configured to dim the light engine, then the desired forward current is not immediately set, but is achieved in a number of voltage sets which in effect allows the device to measure a Voltage-Current (VI) curve of the light engine, or more precisely of the LEDs connected in series, or in parallel, or in some combination. This VI curve is regularly stored in a non-volatile memory, also for further analysis and comparison.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The term "zero-state" used with regards to a state of a driver, may be used herein to mean a driver which has not been used, or alternatively, a "fresh" driver, or a driver which has had little or minimal use. Additionally, "zero-state" may refer to a driver which has a known history or state.

Figure 1:
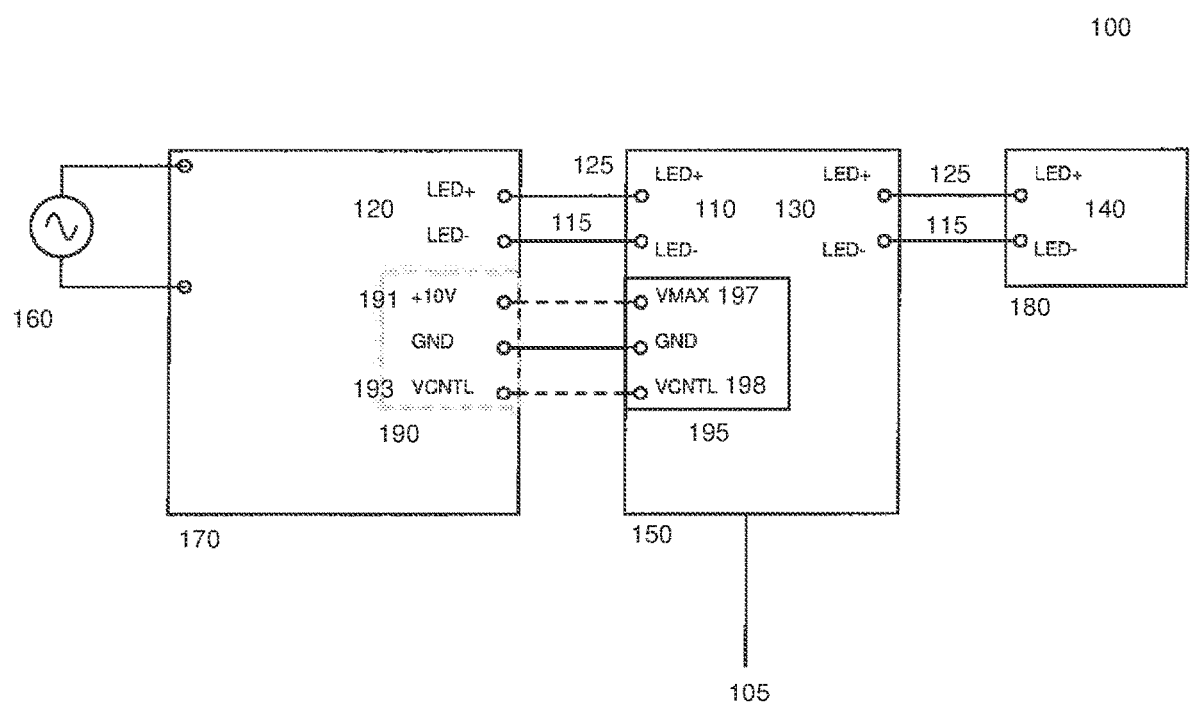
FIG. 1 shows an embodiment of a lighting system for a 0-10V driver control interface.

FIG. 1 shows a lighting system 100 which comprises an assessment device 150 connected in series to a driver 170 and a light engine 180. The assessment device 150 is comprised of an input terminal of the device 110, a device output terminal 130 and a control portion 195. Advantageously, assessment device 150 may be modular, meaning it may be plugged into the lighting system 100. As it may be plugged into lighting system 100 it may also be removed from the lighting system 100. This allows device 150 to be plugged into a third-party manufactured lighting system 100 which has a standard interface. Allowing it to be independent of driver 170 and light engine 180, and to have a service lifetime independent of the other components in the system.

Driver 170 may be an LED driver configured for use in outdoor lighting. Driver 170 may include a switch mode power supply (SMPS). The SMPS may produce noise on LED+ line 125 and LED− line 115. Driver 170 may comprise an Aluminum electrolytic capacitor or e-cap in output 120 that is used for energy storage.

Device 150 may advantageously be configured to control the voltage output to light engine 180, perform a lifetime assessment of driver 170 with a fixed reference voltage and assess the condition of light engine 180.

Device 150 may be connected to driver 170 through a device input terminal 110 connected to driver output terminal 120. FIG. 1 shows driver 150 having a 0-10V standard control interface 190. The 0-10V standard control interface 190 comprises a voltage controller VCNTL 193 that scales the driver output such that at the +10V maximum voltage 191, the output of driver 170, or the power supplied to light engine 180, is at 100% of its potential output. At 0V, driver 170 has 0% output, or no power is supplied to light engine 180. The output of driver 170 may be adjusted or dimmed. For example, by applying 1V of output power, light engine 180 will emit a correspondingly scaled, reduced actual or percieved output of light than that provided at 10v.

Figure 2:
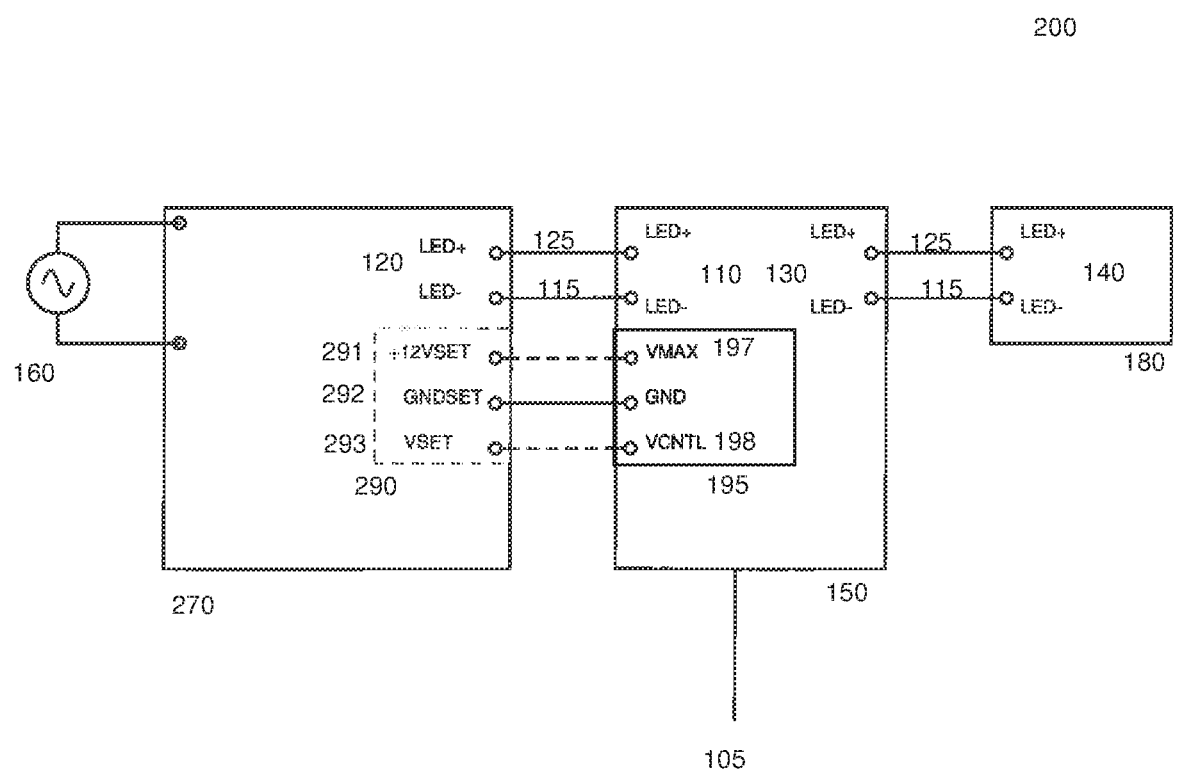
FIG. 2 shows an embodiment of a lighting system for a LEDSET driver control interface.

FIG. 2 describes a lighting system 200, which is similar to FIG. 1, but using a driver 270 which comprises an LEDSET standard interface 290.

Device 150 may be connected to light engine 180 through a device output terminal 130 and a light engine input terminal 140. Light engine 180 may be connected to driver 270 through device 150. Device 150 may be removed from between driver 170 and light engine 180 through a pluggable interface wherein device input terminal 110 is plugged into driver output terminal 220 through an LED+ line 125 and an LED− line 115. Additionally, the device output terminal 130 is plugged into light engine input terminal 140 through LED+ line 125 and LED− line 115.

Figure 3:
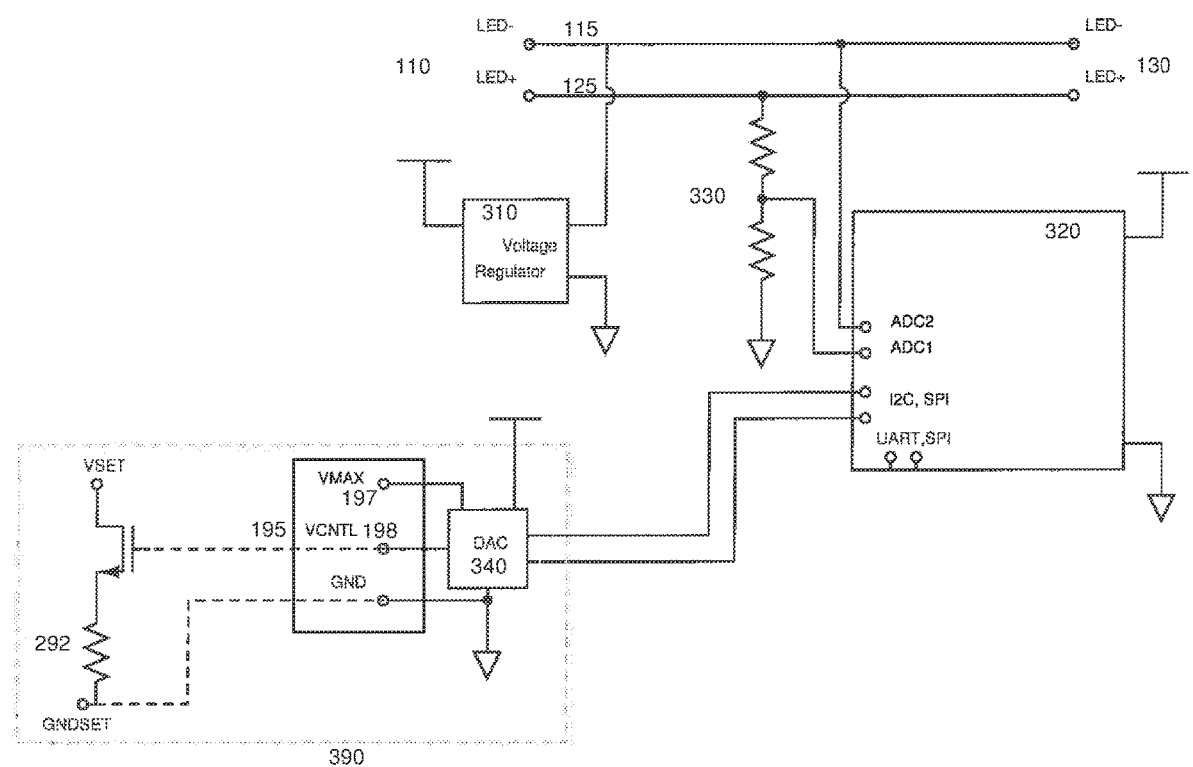
FIG. 3 shows an embodiment of an assessment device.

FIG. 3 shows a detailed embodiment of device 150. Device 150 comprises a voltage regulator 310 configured to provide power to a microcontroller 320. The voltage regulator, may convert high voltage from LED+ lines 125 and ground 350 to the voltage needed for the operation of microcontroller 320 and/or a Digital-to-Analog converter (DAC) 340.

Microcontroller 320 may be a 32-bit microcontroller, which may further advantageously be configured to perform fast Analog-to-Digital sampling. The sampling rate may be at least 1,000,000 samples per second (SPS). Further, the sampling rate may be sufficiently above, e.g. ten times, the maximal switching frequency of the Switch Mode Power Supply (SMPS) 160 comprising driver 170, 270, not to exceed 100,000 Hz. Microcontroller 320 may be configured to sample an LED+ line 125 voltage and an LED-line 115 voltage with respect to a ground 350.

Advantageously, device 150 may be independent, or separable from driver 170, 270 and the light engine 180. Device 150 may be external to driver 170, 270 and advantageously be capable of measuring the performance of driver 170 and light engine 180. Further, device 150 may be configured such that it may be connected or disconnected from driver 170, 270 and light engine 180. This arrangement allows any driver, for example third party drivers, with a standard interface to connect with device 150. This configuration further serves to decouple the service life of device 150 from driver 170, 270 and/or light engine 180.

Still further, device 150 may further comprise a non-volatile memory which is used for long-term persistent storage, such that the stored memory may be retrieved at a later point in time. A non-volatile memory may be retrieved after the power has been turned off and then back on, not requiring constant power in order to prevent data loss.

Device 150 may further comprise additional add-on modules which may include a communication module 105 or interface which may be configured to receive data and information from driver 170, 270 and/or light engine 180. Communication module 105 may deliver or send the lifetime and operating status of driver 170, 270 and/or light engine 180 to an external entity. Further, communication module 105 may be configured to control driver 170, 270 e.g. through Digital Addressable Lighting Interface (DALI) or 0-10V interface. Further, device 150 may be configured to support different sensor modules, the data from which may be broadcasted off-site, or used on-site in choosing the most optimal operating conditions for light engine 180. Device 150 may also be configured to act upon received information communicated through communication module 105, e.g., through 0-10V interface 190 or through other available digital interface. The received information may consist, for example, of setting the dimming level of light engine 180. Some examples of a communication module 105 may consist of, but are not limited to, DALI, Ethernet (wired or wireless), Long Range Radio (LoRA) or Zigbee modules.

Communication module 105 may communicate through some digital protocol to microcontroller 320. Some examples of digital protocol may include, but are not limited to: universal asynchronous receiver-transmitter (UART), inter-integrated circuit (I$^2$C) or serial peripheral interface (SPI).

Device 150 may comprise a control portion 195 which matches and corresponds to an interface 190, 290 of driver 170, 270.

FIG. 3 shows an embodiment of device 150 which may comprise a high resistance voltage divider 330 connected in parallel with the voltage regulator 310. The value, or the voltage needed to drive light engine 180, of the voltage divider 330 is dependent on the voltage provided by driver 170, 270. Voltage divider 330 may be configured to be used by microcontroller 320 to obtain, through a first analog to digital converter (ADC1) information about the electric potential of LED+ line 125 and GND. The microcontroller may further use a second analog to digital converter (ADC2) to measure the potential difference between the LED− line 115 and GND.

Further, the device 150 may comprise a Digital-to-Analog converter (DAC) 340, which may be connected to microcontroller 320. DAC 340 may be configured such that only GND is connected to either a GNDSET of LEDSet interface 290 of driver 270, or in the case of driver 170 with a 0-10V interface 190, GND may be directly connected to GND of driver 170.

Alternatively, device 150 may be configured such that the microcontroller 320 is connected to either GNDSET of LEDSet interface 290 of driver 170, or in the case of driver 170 with a 0-10V interface 190, the GND is connected to a 0-10V interface ground 192. Therefore, DAC 340 may not be considered necessary in a device 150 which is not configured to control light engine 180.

Advantageously, device 150 may be configured such that it controls the input of power into light engine 180. Device 150 may comprises a dimming portion 390. In the case of driver 170 with a 0-10V interface 190, DAC may be directly connected to driver 170 wherein the maximum voltage or VMAX 197 of device 150 is connected to +10V of driver 170, GND of device 150 continues to be connected with 0-10V interface ground and the voltage controller of device 150, or VCNTL may be connected to the voltage controller of the driver, or driver VCNTL. In the case of driver 270 with a LEDSet interface 290, device 150 may control the light output of light engine 180 through usage of DAC 340 through a FET 380.

FIG. 2 shows an embodiment for the connection of LEDSet control interface 290 where VMAX 197 of device 150 is connected to +12VSET of driver 270, GND of device 150 is connected to ground of driver 270, or GNDSET 292, and VCNTL 198 may be connected to VSET 293 of driver 270. DAC 340 may be configured to control the resistance of FET 380 through which VSET of the driver 270 is connected to GNDSET.

A device 150 configured to dim may be configured such that dimming portion 390 may be removable with a pluggable mechanism, such that when removed, GND of control portion 195 of device 150 may be connected to ground of the driver 170, 270. This configuration would advantageously allow device 150 to be easily converted from a dimming device to a non-dimming device or vice versa.

DAC 340 may be connected to the microcontroller 320 wherein microcontroller 320 is configured to control the device output 130 to light engine input 140. In turn, controlling the light output of light engine 180. Device 150 is configured to set light engine forward current through 0-10V standard control interface 190.

Figure 5:
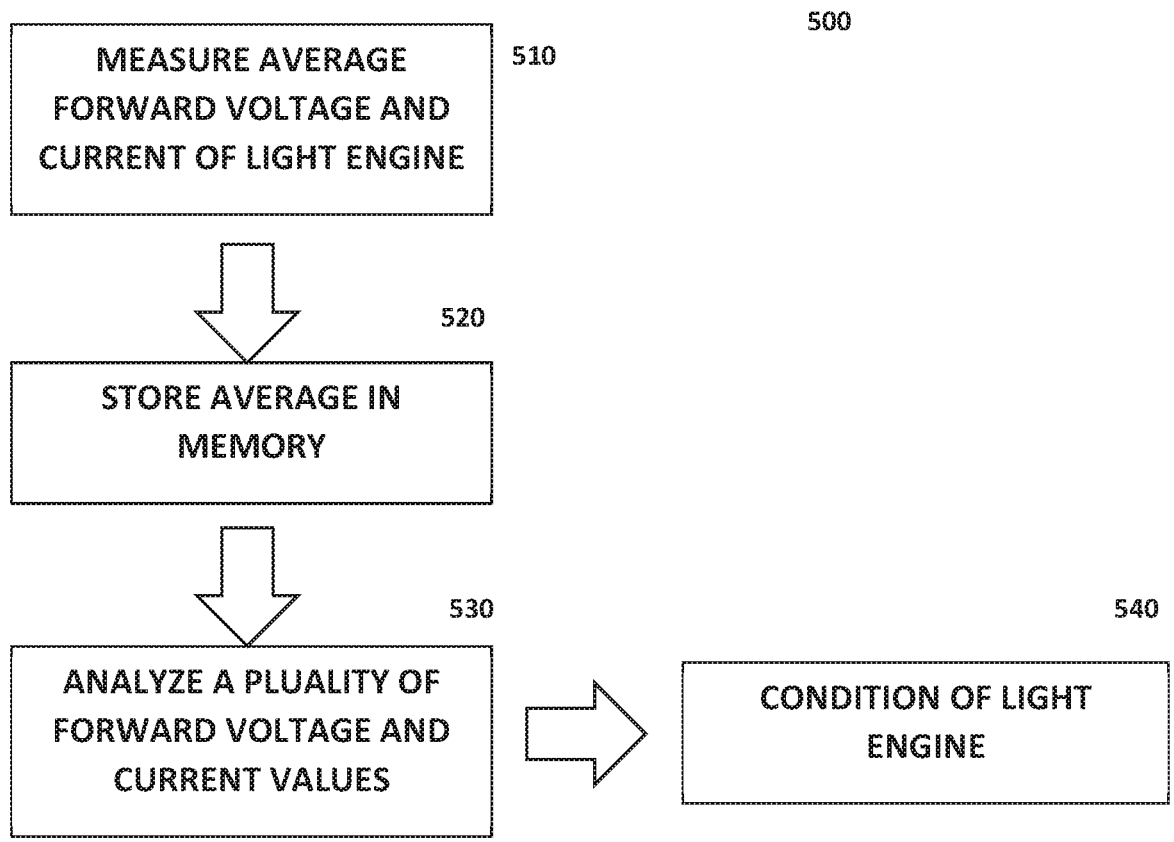
FIG. 5 shows a method for determining the condition of a light engine.
Figure 6:
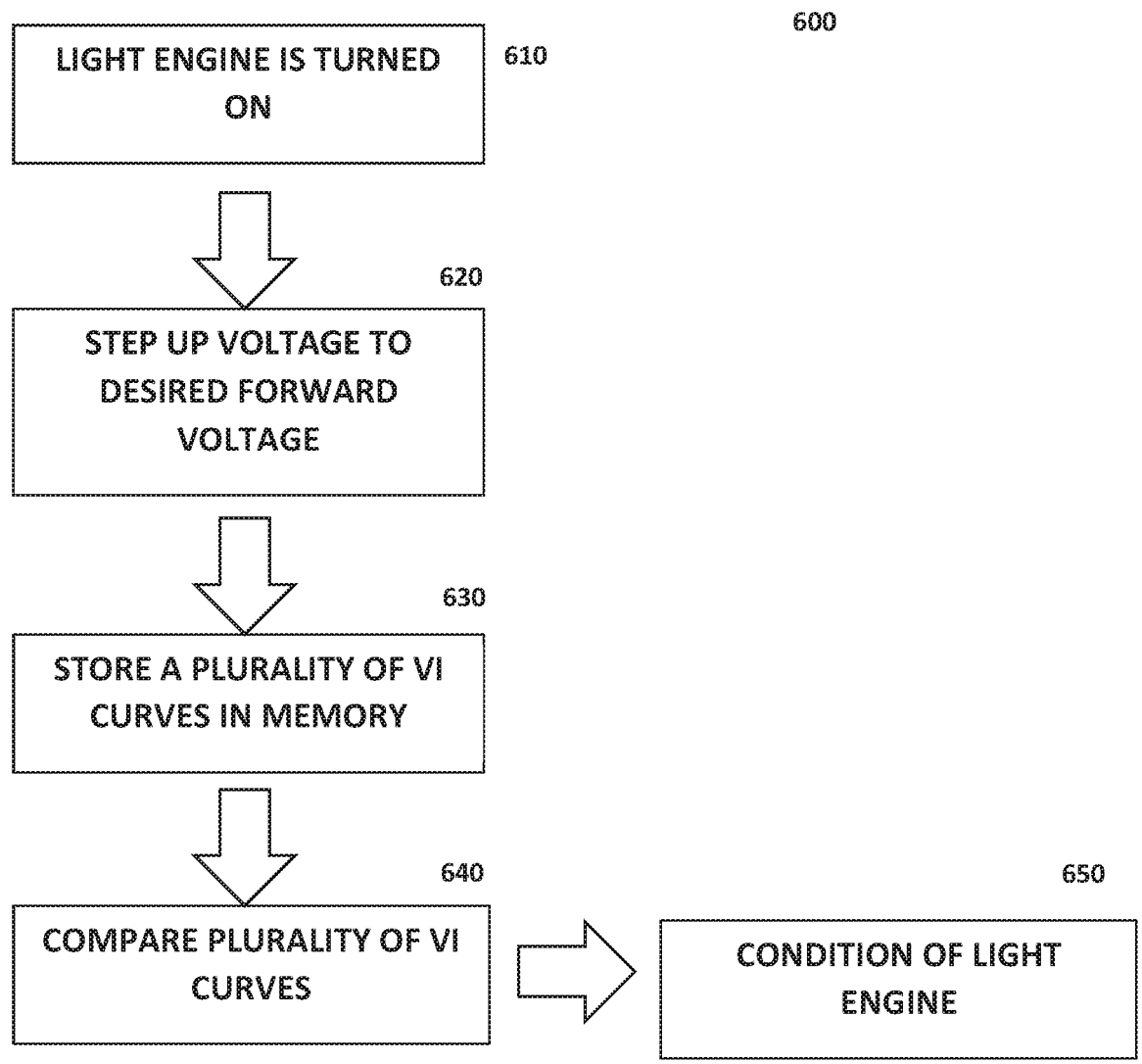
FIG. 6 shows a method for determining the condition of a light engine.

Additionally, device 150 may be configured to estimate the condition of light engine 180 as shown in the method of FIGS. 5 and 6.

Device 150 may be initially connected or plugged into driver 170, 270 which is new or has a known condition or number of hours of operation. Data gathered further in time is compared with values determined while driver 170 is new at zero-hours or has a known history or state.

Driver 170, 270 may be configured as a LED driver used for outdoor lighting. Such drivers may belong to a SMPS 160.

Figure 4:
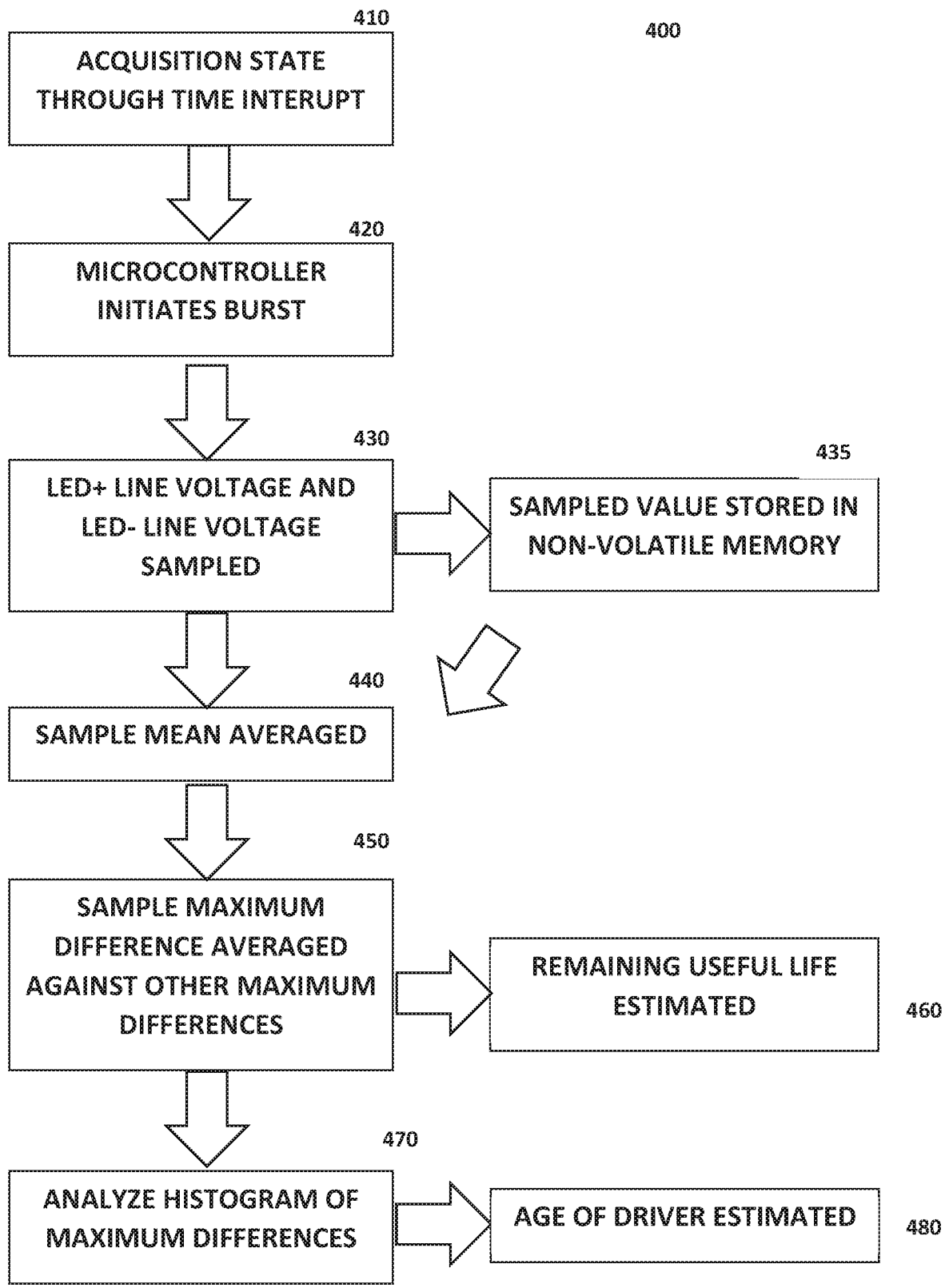
FIG. 4 shows a method for assessing the useful life and age of driver.

FIG. 4 shows a method 400 for assessing driver 170, 270 using device 150. Device 150 may be configured to estimate the remaining useful life of driver 170, 270 and estimate the age of driver 170, 270.

While driver 170, 270 is in a new or known state device 150 may enter an aquisition state through time interrupt 410. This may occur at some high frequency in the range of a few kHz to 1/10 of the switching frequency of the SMPS 160.

While in the interrupted state, the microcontroller 320 may initiate a burst 420 of a length of some power of 2 e.g., 2, 4, 8 or 16 of fast ADC in which the voltages on LED+ line 125 and LED− line 115 are sampled 430 with respect to GND. The sampling may be stored 435 as a zero-state driver value in a local non-volatile memory. The zero-state driver values may be accessed at a later time.

After a predetermined amount of time, device 150 may reenter an acquisition state through time interrupt 410. Similar to obtaining the zero-state values, the voltages on LED+ line 125 and LED− line 115 are sampled 430 with respect to GND to obtain and stored 435 in the memory. This process may be repeated a predetermined number of times. The acquisition state may be entered almost periodically or, alternatively, may be initiated at a command by a user.

Over each signal sample a sample mean of the voltages and a maximal difference between two data point in the sample may be determined.

The sample mean may be averaged 440 along with other sample means collected within a certain period of time, i.e. 2 seconds to the overall average of the LED+ line 125 and the LED− line 115.

The maximal difference may be obtained in two steps. First, the maximal difference may be averaged 450 along with other maximal differences collected within a certain period of time, i.e. 2 seconds, to the overall average of the LED+ line 125 and the LED− line 115. This number may be combined with either the known value of driver 170, 270 at zero-hours, or to a similarly measured value for a driver with a known history or state. From this analysis the remaining useful life of driver 170, 270 may be determined 460 by comparing the zero-hours driver value with the averaged maximal difference 450. Second, the highest values, i.e. 16 values, of the maximal difference and the frequency in which they appear are stored in the non-volatile memory. The frequencies may be organized into histogram bins determined either from the memory or are estimated from the zero-hours, or known state measurement.

Based on the estimated histogram of the maximum sample differences 470 the age of the driver may be accessed 480. The histogram may proved two pieces of information. Firstly, as the e-cap in driver 170, 270 ages its internal resistance will increase. The increase in internal resistance creates a drift in the average maximal sample difference. This drift may be captured by the ADC of microcontroller provided that the sampling rate is sufficiently high. Secondly, the histogram may provide information on the operation of the SMPS. As the performance of SMPS degrades, it will manifest itself in skewed statistics of extreme events, or minimums and maximums, compared to normal operations.

Additionally, device 150 may be configured to assess the condition of the light engine. This may be done using two methods.

The first method is described in FIG. 5, showing a method 500 for assessing the condition of the light engine for an embodiment of device 150 where device 150 is not configured to control the light output of light engine 180. In this exemplary method, the average forward voltage and the current of light engine 180 is measured 510 to obtain a light engine value. These values are measured periodically during the operation of light engine 180. The measurements may be performed at specified intervals, or a user may communicate to device 150 to perform a measurement. The plurality of light engine values may be stored in the non-volatile memory 520 for further analysis. Changes in the light engine values over time may be analyzed 530 to observe the condition of the light engine 540.

The second method 600 shown in FIG. 6, describes assessing the condition of light engine 180 for an embodiment of device 150 where device 150 is configured to control the light output of light engine 180. At turn the on of the light in the light engine 610, the voltage is stepped-up to a desire forward voltage 620, allowing device 150 to measure a Voltage-Current (VI) curve of the light engine 180. The stepped-up voltage may be performed in a predetermined number of steps. To be more precise, the measurement would be taken of the light engine LEDs connected in series, or in parallel or some combination of series and parallel. The VI curve is stored in the non-volatile memory 630 for analysis at a later time. Each time light engine 180 is turned on the same process may be performed, storing each VI curve in the memory. The plurality of VI curves may be compared 650 to analyze the condition of the light engine 650 by observing the curves for any shifts over time.

The condition of light engine 180 may be sent to an outside source using communication module 105. Further, the communication module may communicate the remaining useful life of driver 170, 270 along with the age of driver 170, 270.

Example 1 comprises an assessment device for a lighting system, the device comprising: an input terminal which corresponds to an output terminal of a driver; an output terminal which corresponds to an input terminal of a light engine; a voltage regulator configured to provide power to the microcontroller, wherein the microcontroller is configured to sample an LED+ line voltage and an LED− line voltage with respect to a ground; and wherein the device is independent of the driver and the light engine.

In Example 2, the device of example 1 further comprising a non-volatile memory.

In Example 3 the device of examples 1-2, further comprising a communication module.

In Example 4 the device of example 3 wherein the communication module is configured to receive information from the driver.

In Example 5, the device of example 3, wherein the communication module is configured to receive information from the light engine.

In Example 6 the device of example 3 wherein the communication module is configured to receive instructions which set a dimming level of the light engine.

In Example 7 the device of example 6 wherein the communication module is configured to send the remaining useful life information of the driver to an outside source.

In Example 8 the device of examples 3-7, wherein the communication module is a digitally addressable lighting interface (DALI).

In Example 9 the device of examples 3-7, wherein the communication module is a wired Ethernet.

In Example 10 the device of examples 3-7, wherein the communication module is a wireless Ethernet.

In Example 11 the device of examples 3-7, wherein the communication module is a long range radio (LoRa).

In Example 12 the device of example 3-7, wherein the communication module is a ZigBee module.

In Example 13 the device of examples 3-7, wherein the communication module is configured to communicate through a digital protocol to the microcontroller.

In Example 14, the device of examples 1-7, wherein the input terminal of the device matches a control terminal of the driver.

In Example 15 the device of examples 1-14 further comprising a high resistance voltage divider in parallel with the voltage regulator.

In Example 16 the device of claim 15 wherein the voltage divider is configured to obtain through a first analog to digital converter (ADC1) information about the electric potential of the LED+ line and the ground.

In Example 17, the device of examples 1-16, the microcontroller further comprising a second analog to digital converter (ADC2), wherein the second analog to digital converter measures the potential difference between the LED− line and the ground.

In Example 18, the device of examples 1-17 further comprising a digital to analog converter (DAC).

In Example 19 the device of example 18, wherein an input of the DAC is connected to an output of the microcontroller.

In Example 20 the device of examples 1-19 wherein the voltage regulator is configured to convert the high voltage from the LED+ line and the ground to a predetermined voltage for operating the microcontroller.

In Example 21 the device of examples 1-19 wherein the voltage regulator is configured to convert the high voltage from the LED+ line and the ground to a predetermined voltage for operating the DAC In Example 22 the device of examples 19-21 wherein an output of the DAC is directly connected to a control input on a 0-10 V standard control interface.

In Example 23 the device of example 22, wherein the device is configured to set the light engine forward current through the 0-10 V standard control interface.

In Example 24 the device of example 19-21, wherein an output of the DAC is directly connected to a LEDSET standard control interface In Example 25 the device of example 24 wherein the DAC is configured to control the resistance of an FET through which a VSET of the driver is connected to the ground in a LEDSET interface.

In Example 26 the device of example 18-25, wherein the device is configured to control the voltage output to the light engine.

In Example 27 the device of example 26 wherein the device is configured to dim a light source of the light engine.

In Example 28 the device of example 1-27, wherein the device is configured to perform a lifetime assessment on any driver with a fixed reference voltage.

In Example 29 the device of example 1-28, wherein the microcontroller is a 32-bit microcontroller.

In Example 30 the device of example 1-29, wherein the microcontroller is configured to perform a fast Analog-to-Digital sampling rate.

In Example 31 the device of example 30, wherein the sampling rate is configured to be at least 1,000,000 samples per second.

In Example 32 the device of claim 30-31, wherein the sampling rate is above a maximal switching frequency of a Switch Mode Power supply of the driver.

In Example 33 the device of example 30-32, wherein the sampling rate is at least 10 times above the maximal switching frequency of the Switch Mode Power supply of the driver.

In Example 34 the device of example 1-33, wherein the device is configured to perform a lifetime assessment of the driver.

In Example 35 the device of example 1-34, wherein the device is configured to assess the condition of the light engine.

Example 36 comprises a method for assessing the condition of a lighting system using an assessment device, the method comprising: connecting the device to a driver in a zero- or known state, wherein the device comprises: an input terminal which corresponds to an output terminal of the driver; an output terminal which corresponds to an input terminal of a light engine; a voltage regulator configured to provide power to the microcontroller, wherein the microcontroller is configured to sample an LED+ line voltage and an LED− line voltage with respect to a ground; entering an acquisition state in which the driver is in the zero-state wherein the microcontroller samples the LED+ line voltage and the LED− line voltage with respect to the ground to obtain a sample; storing a zero-state driver value in a local non-volatile memory; at least once reentering the acquisition state after a predetermined amount of time; and extracting a value.

In Example 37 the method of example 36, wherein the acquisition state comprises: entering a time interrupted state wherein the microcontroller initiates a signal sample burst of fast analog-to-digital conversion in which the voltages on the LED+ line and the LED− line are sampled with respect to ground.

In Example 38 the method of example 37, wherein each signal sample burst is a length of some power of 2.

In Example 39 the method of example 36-38, further comprising extracting from the sample a sample mean of the voltages.

In Example 40 the method of example 36-39, further comprising extracting from the sample a maximum difference between at least two data points.

In Example 41 the method of example 40, further comprising averaging at least two maximal differences to obtain an average maximal difference.

In Example 42 the method of example 41, wherein at least one maximal difference is a zero-state maximal difference.

In Example 43 the method of example 42, further comprising estimating a remaining useful life of the driver using the zero-state maximal difference and the average maximal difference.

In Example 44 the method of example 36-44, further comprising storing the highest 16 values of the maximum difference in the non-volatile memory of the microcontroller.

In Example 45 the method of example 44, further comprising storing a frequency at which each maximum sample difference occurs.

In Example 46 the method of example 45, further comprising creating a histogram of the maximum sample differences.

In Example 47 the method of example 46, further comprising determining the age of the driver based on the histogram.

In Example 48 the method of example 36, further comprising periodically measuring the average forward voltage and current of the light engine to obtain at a plurality of light engine values.

In Example 49 the method of example 48, further comprising storing the light engine values in the non-volatile memory.

In Example 50 the method of example 49, further comprising storing a frequency at which each light engine value occurs.

In Example 51 the method of example 50, further comprising creating a histogram of the light engine values.

In Example 52 the method of example 46, further comprising determining the condition of the light engine.

In Example 53 the method of claim 36, further comprising: turning on the light engine; and reaching a desired forward current by performing a predetermined number of voltage steps.

In Example 54 the method of example 53, further comprising measuring a Voltage-Current (VI) curve of the light engine.

In Example 55 the method of example 54, further comprising storing the VI curve in the non-volatile memory.

In Example 56 the method of example 53-55, further comprising measuring the VI curve each time the light engine is turned on.

In Example 57 the method of example 56, further comprising comparing VI curves to determine a condition of the light engine.

In Example 58 the method of example 57, further comprising sending the condition of the light source to an outside source using a communication module.

In Example 59 the method of example 52, further comprising sending the condition of the light source to an outside source using a communication module.

In Example 60 the method of example 43, further comprising sending the remaining useful life of the driver to an outside source using a communication module.

In Example 61 the method of claim 47, further comprising sending the age of the driver to an outside source using a communication module.

Example 62 comprises a lighting system comprising: a light engine; a driver for operating the light engine; an assessment device independent of the driver, the device comprising: an input terminal which corresponds to an output terminal of a driver; an output terminal which corresponds to an input terminal of a light engine; a voltage regulator configured to provide power to the microcontroller, wherein the microcontroller is configured to sample an LED+ line voltage and an LED− line voltage with respect to a ground; and wherein the device is independent from the driver and the light engine.

In Example 63 the system of example 62 further comprising a non-volatile memory.

In Example 64 the system of example 62-63, further comprising a communication module.

In Example 65 the system of example 64 wherein the communication module is configured to receive information from the driver.

In Example 66 the system of example 64, wherein the communication module is configured to receive information from the light engine.

In Example 67 the system of claim 64 wherein the communication module is configured to receive instructions which set a dimming level of the light engine.

In Example 68 the system of claim 67 wherein the communication module is configured to send the remaining useful life information of the driver to an outside source.

In Example 69 the system of example 64-68, wherein the communication module is a digitally addressable lighting interface (DALI).

In Example 70 the system of example 64-68, wherein the communication module is a wired Ethernet.

In Example 71 the system of example 64-68, wherein the communication module is a wireless Ethernet.

In Example 72 the system of example 64-68, wherein the communication module is a long range radio (LoRa).

In Example 73 the system of example 64-68, wherein the communication module is a ZigBee module.

In Example 74 the system of example 64-68, wherein the communication module is configured to communicate through a digital protocol to the microcontroller.

In Example 75 the system of example 62-68, wherein the input terminal of the device matches a control terminal of the driver.

In Example 76 the system of examples 62-75 further comprising a high resistance voltage divider in parallel with the voltage regulator.

In Example 77 the system of example 76 wherein the voltage divider is configured to obtain through a first analog to digital converter (ADC1) information about the electric potential of the LED+ line and the ground.

In Example 78 the system of examples 62-77, the microcontroller further comprising a second analog to digital converter (ADC2), wherein the second analog to digital converter measures the potential difference between the LED− line and the ground.

In Example 79 the system of examples 62-78 further comprising a digital to analog converter (DAC).

In Example 80 the system of example 79, wherein an input of the DAC is connected to an output of the microcontroller.

In Example 81 the system of examples 62-80 wherein the voltage regulator is configured to convert the high voltage from the LED+ line and the ground to a predetermined voltage for operating the microcontroller.

In Example 82 the system of examples 62-80 wherein the voltage regulator is configured to convert the high voltage from the LED+ line and the ground to a predetermined voltage for operating the DAC In Example 83 the system of examples 80-82 wherein an output of the DAC is directly connected to a control input on a 0-10 V standard control interface.

In Example 84 the system of examples 83, wherein the device is configured to set the light engine forward current through the 0-10 V standard control interface.

In Example 85 the system of examples 80-82, wherein an output of the DAC is directly connected to a LEDSET standard control interface.

In Example 86 the system of example 85 wherein the DAC is configured to control the resistance of an FET through which a VSET of the driver is connected to the ground in a LEDSET interface.

In Example 87 the system of examples 79-86, wherein the device is configured to control the voltage output to the light engine.

In Example 88 the system of example 87 wherein the device is configured to dim a light source of the light engine.

In Example 89 the system of examples 62-88, wherein the device is configured to perform a lifetime assessment on any driver with a fixed reference voltage.

In Example 90 the system of examples 62-89, wherein the microcontroller is a 32-bit microcontroller.

In Example 91 the system of claim 62-90, wherein the microcontroller is configured to perform a fast Analog-to-Digital sampling rate.

In Example 92 the system of example 91, wherein the sampling rate is configured to be at least 1,000,000 samples per second.

In Example 93 the system of example 91-92, wherein the sampling rate is above a maximal switching frequency of a Switch Mode Power supply of the driver.

In Example 94 the system of example 91-93, wherein the sampling rate is at least 10 times above the maximal switching frequency of the Switch Mode Power supply of the driver.

In Example 95 the system of examples 62-94, wherein the device is configured to perform a lifetime assessment of the driver.

In Example 96 the system of examples 62-95, wherein the device is configured to assess the condition of the light engine.

In Example 97 the system of examples 62-96, wherein the driver comprises an aluminum electrolytic capacitor in the driver output.

In Example 98 the system of example 97, wherein the aluminum electrolytic capacitor is used for energy storage.

In Example 99 the system of examples 62-98, wherein the driver is an LED driver.

In Example 100 the system of examples 62-99, wherein the lighting system is an outdoor lighting system.

In Example 101 the system of examples 62-100 wherein the driver is a switch mode power supply (SMPS).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An assessment device for a lighting system, wherein the assessment device comprises:
    an input terminal which corresponds to an output terminal of a driver;
    an output terminal which corresponds to an input terminal of a light engine;
    a voltage regulator configured to provide power to a microcontroller,
    wherein the microcontroller is configured to sample an LED+ line voltage and an LED− line voltage with respect to a ground; and
    wherein the assessment device is independent of the driver and the light engine;
    and wherein the assessment device further comprises a memory configured to store a zero-state LED+ line voltage and a zero-state LED− line voltage therein;
    wherein the microcontroller is configured to sample the LED+ line voltage and the LED− line voltage with respect to ground a second time after a predetermined amount of time; wherein the microcontroller is configured to extract a sample mean of the voltages and a maximal difference of the voltages; and wherein the microcontroller is configured to compare the sample mean of the voltages and the maximal difference of the voltages to the zero-state voltages.

2. The assessment device of claim 1 further comprising a voltage divider in parallel with the voltage regulator.

3. The assessment device of claim 2 wherein the voltage divider is configured to obtain through a first analog to digital converter information about the electric potential of the LED+ line and the ground.

4. The assessment device of claim 2, the microcontroller further comprising a second analog to digital converter, wherein the second analog to digital converter measures a potential difference between the LED− line and the ground.

5. The assessment device of claim 1, wherein the assessment device is configured as a pluggable module.

6. The assessment device of claim 1, further comprising a dimming portion, wherein the dimming portion comprises a digital to analog converter with a control portion.

7. The assessment device of claim 6, wherein the control portion is configured to be connected to a control interface of the driver.

8. A method for assessing the condition of a light engine and a driver for the light engine using an assessment device, the method comprising:
    connecting the assessment device to the driver in a zero-state, wherein the assessment device comprises:
    an input terminal which corresponds to an output terminal of the driver;
    an output terminal which corresponds to an input terminal of the light engine;

a voltage regulator configured to provide power to a microcontroller,
wherein the microcontroller is configured to sample an LED+ line voltage and an LED− line voltage with respect to a ground;
entering an acquisition state in which the driver is in the zero-state wherein the microcontroller initiates a burst and samples the voltages on an LED+ line and an LED− line with respect to the ground;
storing a zero-state LED+ line voltage and a zero-state LED− line voltage in a local non-volatile memory;
reentering the acquisition state after a predetermined amount of time;
extracting a sample mean of the voltages and a maximal difference of the voltages;
comparing the sample mean of the voltages and the maximal difference of the voltages to the zero-state voltages.

9. The method of claim 8, wherein the acquisition state comprises:
entering a time interrupted state wherein the microcontroller initiates a signal sample burst of fast analog-to-digital conversion in which the voltages on the LED+ line and the LED− line are sampled with respect to ground.

10. The method of claim 8, further comprising averaging the maximal difference with other maximal differences collected in a determined time period to obtain a maximal difference average.

11. The method of claim 10, further comprising combining the maximal difference average with the zero-state LED+ line voltage and the zero-state LED− line voltage.

12. The method of claim 11, further comprising estimating a remaining useful life of the driver.

13. The method of claim 8, further comprising periodically measuring the average forward voltage and current of the light engine to obtain at a plurality of light engine values; and
storing the light engine values in the non-volatile memory.

14. The method of claim 13, further comprising comparing the measured light engine values and determining the condition of the light engine.

15. The method of claim 8, further comprising:
turning on the light engine;
reaching a desired forward current by performing a predetermined number of voltage step; and
measuring a Voltage-Current (VI) curve of the light engine.

16. The method of claim 15, further comprising storing a plurality of VI curves in the non-volatile memory.

17. The method of claim 16, further comprising comparing VI curves to determine a condition of the light engine.

18. A lighting system comprising:
a light engine;
a driver for operating the light engine;
an assessment device independent of the driver, the assessment device comprising:
an input terminal which corresponds to an output terminal of the driver;
an output terminal which corresponds to an input terminal of the light engine;
a voltage regulator configured to provide power to a microcontroller,
wherein the microcontroller is configured to sample an LED+ line voltage and an LED− line voltage with respect to a ground; and
wherein the assessment device is independent from the driver and the light engine; and wherein the assessment device further comprises a memory configured to store a zero-state LED+ line voltage and a zero-state LED− line voltage therein; wherein the microcontroller is configured to sample the LED+ line voltage and the LED− line voltage with respect to ground a second time after a predetermined amount of time; wherein the microcontroller is configured to extract a sample mean of the voltages and a maximal difference of the voltages; and wherein the microcontroller is configured to compare the sample mean of the voltages and the maximal difference of the voltages to the zero-state voltages.

* * * * *